United States Patent
Baldridge

(10) Patent No.: US 9,702,910 B2
(45) Date of Patent: Jul. 11, 2017

(54) POWER CONTROLLER

(71) Applicant: Micropac Industries, Inc., Garland, TX (US)

(72) Inventor: Wayne Baldridge, Garland, TX (US)

(73) Assignee: MICROPAC INDUSTRIES, INC., Garland, TX (US)

( * ) Notice: Subject to any disclaimer, the term of this patent is extended or adjusted under 35 U.S.C. 154(b) by 385 days.

(21) Appl. No.: 14/460,308

(22) Filed: Aug. 14, 2014

(65) Prior Publication Data

US 2015/0057822 A1    Feb. 26, 2015

Related U.S. Application Data

(60) Provisional application No. 61/870,117, filed on Aug. 26, 2013.

(51) Int. Cl.
*G06D 5/00*    (2006.01)
*G05D 9/00*    (2006.01)
(Continued)

(52) U.S. Cl.
CPC .............. *G01R 21/06* (2013.01); *H02H 3/08* (2013.01); *H03K 17/0822* (2013.01);
(Continued)

(58) Field of Classification Search
None
See application file for complete search history.

(56) References Cited

U.S. PATENT DOCUMENTS 4,259,706 A    3/1981    Zocholl
4,291,357 A    9/1981    Hong
(Continued)

FOREIGN PATENT DOCUMENTS

KR    10-2010-0070494 A    8/2010

OTHER PUBLICATIONS

Cuiqing Du; VSC-HVDC for Industrial Power Systems; Thesis for the Degree of Doctor of Philosophy; May 3, 2007; Div. of Electric Power Engineering; Dept. of Energy and Environment; Chalmers University of Technology; Goteborg, Sweden.
(Continued)

*Primary Examiner* — Mohammad Ali
*Assistant Examiner* — Md Azad
(74) *Attorney, Agent, or Firm* — Daniel J. Chalker; Edwin S. Flores; Chalker Flores, LLP

(57) ABSTRACT

A power controller includes an input power terminal, an output power terminal, a power switching circuit connected between the input power terminal and the output power terminal, a detection circuit connected to the power switching circuit, one or more data interfaces, and a control device connected to the detection circuit and the one or more data interfaces. The detection circuit measures a load current and a current squared time ($I^2t$) value between the input power terminal and the output power terminal. The control device automatically turns the power switching circuit "OFF" whenever the load current exceeds a first value or the current squared time value exceeds a second value or an "OFF" signal is received from the one or more data interfaces, and automatically turns the power switching circuit "ON" whenever an "ON" signal is received from the one or more data interfaces.

77 Claims, 10 Drawing Sheets

(51) Int. Cl.
G05D 11/00 (2006.01)
G05D 3/12 (2006.01)
H02H 3/00 (2006.01)
H01H 73/00 (2006.01)
H05B 7/11 (2006.01)
G06E 3/00 (2006.01)
G05F 1/00 (2006.01)
G01R 21/06 (2006.01)
H03K 17/082 (2006.01)
H03K 17/18 (2006.01)
H03K 17/691 (2006.01)
H02H 3/08 (2006.01)
H03K 17/795 (2006.01)

(52) U.S. Cl.
CPC ............ *H03K 17/18* (2013.01); *H03K 17/691* (2013.01); *H03K 17/7955* (2013.01); *H03K 2217/0027* (2013.01)

(56) References Cited

U.S. PATENT DOCUMENTS

| | | |
|---|---|---|
| 4,302,688 A | 11/1981 | Havel et al. |
| 4,408,131 A | 10/1983 | Fox |
| 4,626,954 A | 12/1986 | Damiano et al. |
| 4,680,490 A | 7/1987 | Baker et al. |
| 4,770,514 A | 9/1988 | Silverglate |
| 4,804,866 A | 2/1989 | Akiyama |
| 5,172,291 A | 12/1992 | Bakely et al. |
| RE34,163 E | 1/1993 | Aubrey et al. |
| 5,216,157 A | 6/1993 | Benko et al. |
| 5,216,412 A | 6/1993 | Gawell et al. |
| 5,606,482 A | 2/1997 | Witmer |
| 5,708,253 A | 1/1998 | Bloch et al. |
| 5,723,915 A | 3/1998 | Maher et al. |
| 5,724,477 A | 3/1998 | Webster et al. |
| 5,894,414 A | 4/1999 | Jiang |
| 5,923,103 A | 7/1999 | Pulizzi et al. |
| 5,926,354 A | 7/1999 | King |
| RE36,787 E | 7/2000 | Hansen et al. |
| 6,154,846 A | 11/2000 | Arai |
| 6,347,024 B1 | 2/2002 | Blain et al. |
| 6,400,190 B1 | 6/2002 | Lacombe |
| 6,466,468 B1 | 10/2002 | York |
| 6,515,610 B1 | 2/2003 | McCall et al. |
| 6,547,423 B2 | 4/2003 | Marshall et al. |
| 6,654,175 B2 | 11/2003 | Brophy et al. |
| 6,668,963 B2 | 12/2003 | Nada |
| 6,671,194 B2 | 12/2003 | Takahashi |
| 6,690,588 B2 | 2/2004 | York |
| 6,755,556 B2 | 6/2004 | Gasquet et al. |
| 6,757,821 B1 | 6/2004 | Akiyama et al. |
| 6,784,629 B2 | 8/2004 | Choi |
| 6,963,042 B1 | 11/2005 | Kouris |
| 7,021,839 B2 | 4/2006 | Ho |
| 7,119,450 B2 | 10/2006 | Albrecht |
| 7,141,833 B2 | 11/2006 | Hehemann et al. |
| 7,256,410 B2 | 8/2007 | Yamaguchi |
| 7,274,043 B2 | 9/2007 | Erchak et al. |
| 7,506,990 B2 | 3/2009 | Glazner |
| 7,520,650 B2 | 4/2009 | Smith |
| 7,696,458 B2 | 4/2010 | Thomas et al. |
| 7,933,126 B2 | 4/2011 | Jain |
| 2005/0073196 A1 | 4/2005 | Kamiya |
| 2005/0286200 A1 | 12/2005 | Ohshima |
| 2006/0226879 A1 | 10/2006 | Kitamura |
| 2007/0014066 A1* | 1/2007 | Ye .............. H02H 6/005 361/100 |
| 2007/0216459 A1 | 9/2007 | Tzeng |
| 2009/0187314 A1 | 7/2009 | Kitamura et al. |
| 2009/0237047 A1 | 9/2009 | Matsugaki et al. |
| 2010/0019579 A1 | 1/2010 | Amerom et al. |
| 2011/0071970 A1 | 3/2011 | Massie et al. |
| 2012/0054511 A1 | 3/2012 | Brinks et al. |
| 2012/0223591 A1 | 9/2012 | Cheon et al. |
| 2013/0057241 A1* | 3/2013 | Shuvalov ............. H03K 17/122 323/271 |
| 2014/0029152 A1* | 1/2014 | Mazzola ............ H03K 17/6871 361/115 |
| 2014/0218200 A1* | 8/2014 | Chen .................... H02H 3/087 340/644 |

OTHER PUBLICATIONS

Eaton; UL 508A; Industrial Control Panels Power Distribution and Control Power Point Presentation; Lunch & Learn Training; Oct. 4, 2005.
Evalds, Paul; SCR Power Controls Provide Reliable Industrial Electric Heating; reprinted from Industrial Heating; Oct. 2002; Avatar Instruments, Broomall, PA.
Gator ATX-G Low Power ATX Industrial Controler Based on the Intel Pentium 4 Processor-M Data Sheet; Jan. 21, 2005.
Industrial Controllers; N13100, NI 3110; National Instruments; Product brochure; Apr. 28, 2009.
Industrial Power Switch User's Guide; Year: 2005; IPC-800 Power Controller; Digital Loggers, Inc., Santa Clara, CA 95051.
Programmable Industrial Controller; Design Note #34; Jul. 18, 2008; Motorola MC68HCS12 Processor; Maynard, MA 01754.
GE Consumer & Industrial Power Quality; MX250 Entilli-Switch Microprocesor Controller Data Sheet; Oct. 4, 2006; GeneratorJoe; Santa Rosa, CA 95405.
Novar Controller; Automatic Power Factor Control brochure; Jul. 15, 2004.
Omron Corporation; Multi-Channel Power Controller G3ZA Datasheet; Jan. 9, 2007; Kyoto, Japan.
Stmicroelectronics; PM6680A:3 Output Power Controller for Industrial Applications Brochure; Oct. 16, 2006.
Watlow; Microprocessor-Based SCR Power Controller; Power Series User's Manual; Apr. 19, 2000; Winona, MN 55987.
Spang Power Electrics; 851 Digital SCR Power Controller, 850 Digital Power Controllers Product Brochure; Mar. 2, 2005; Mentor, OH 44060.
Texas Instruments; UCC28820, UCC28811-SLUS865; LED Lighting Power Controller Fact Sheet; Oct. 2008.
Traco Power; Industrial Power Supplies; TSP Series, 90-600 Watt Product Brochure; Jan. 7, 2008; Zurich, Switzerland.
Korean International Property Office (ISA); International Search Report; Dec. 1, 2014 for PCT/US2014/051159.

* cited by examiner

POWER CONTROLLER

PRIORITY CLAIM AND RELATED APPLICATION DATA

This application is a non-provisional application of U.S. provisional patent application No. 61/870,117, filed on Aug. 26, 2013 which application is hereby incorporated by reference in its entirety.

STATEMENT OF FEDERALLY FUNDED RESEARCH

Not Applicable.

TECHNICAL FIELD OF THE INVENTION

The present invention relates in general to the field of power controllers.

BACKGROUND OF THE INVENTION

Without limiting the scope of the invention, its background is described in connection with Solid State Relays (SSR) and Industrial Power Controllers (IPC). Relays and controllers that use optical coupling for setting the ON or OFF condition and use power FET devices for switching AC or DC loads have been known to have some vulnerabilities with catastrophic load failure. These load failures can often cause destructive damage of relays and controllers, including burning or melting of enclosures, and/or failure of the load switching FETs. Conditions of the load, shorted or exceeding expected circuit load conditions should be protected to avoid damage or destruction of wiring, loads, SSRs, and IPCs.

As circuit technologies have improved in recent years, it has become more clear that isolated control signals as inputs and outputs from the circuit breaker provide advanced features and benefits to improve functionality to the relays and power controllers. Accordingly, there is a need to prevent catastrophic and destructive failure within SSRs and IPCs with added new features.

SUMMARY OF THE INVENTION

The present invention prevents catastrophic and destructive failures with a Solid State Relay (SSR) by adding new features, including, but not limited to (1) remote load current monitoring, (2) remote operation that performs ON and OFF control, and (3) over-current or over-voltage fault detection with near-instant OFF control. New features create an Industrial Power Controller (IPC) with each feature directly contributing to improved reliability and elimination of destructive vulnerabilities.

The structure of the invention relates to the application of features that are new to the applications of SSR circuit breakers used as IPCs. The nature of the device brings together the physical placement of SSR photo emitters and detectors, and control electronics that includes use of bi-directional control signals. The controls are optically isolated and allow remote monitoring of the circuit breaker as well as signals that control the state of the circuit breaker. The purpose of the invention is to allow the circuit breaker to operate in a safe manner without ever having a destructive failure mode.

More specifically, the present invention provides a power controller having an input power terminal, an output power terminal, a power switching circuit connected between the input power terminal and the output power terminal, a detection circuit connected to the power switching circuit, one or more data interfaces, and a control device connected to the detection circuit and one or more data interfaces. The detection circuit measures a load current and a current squared time ($I^2t$) value between the input power terminal and the output power terminal. The control device automatically turns the power switching circuit "OFF" whenever the load current exceeds a first value or the current squared time value exceeds a second value or an "OFF" signal is received from the one or more data interfaces, and automatically turns the power switching circuit "ON" whenever an "ON" signal is received from the one or more data interfaces.

In addition, the present invention provides a power controller having an enclosure, an input power terminal accessible from an exterior of the enclosure, an output power terminal accessible from an exterior of the enclosure, a power switching circuit disposed within the enclosure and connected between the input power terminal and the output power terminal, a detection circuit disposed within the enclosure and connected to the power switching circuit, one or more isolated data interfaces accessible from an exterior of the enclosure, an isolation circuit disposed within the enclosure and connected to the one or more data interfaces, a control device disposed within the enclosure and connected to the power switching circuit, the detection circuit and the isolation circuit, an isolated control power supply disposed within the enclosure and connected to at least the control device and the detection circuit, one or more external control power source terminals accessible from an exterior of the enclosure, and a filter circuit disposed within the enclosure and connected between the one or more external control power source terminals and the isolated control power supply. The power switching circuit includes one or more power field-effect transistors. The detection circuit includes a load current detection circuit having one or more resisters connected between the power switching circuit and one of the power terminals such that a first voltage across the one or more resistors is proportional to a load current, a current squared time ($I^2t$) detection circuit having a RC circuit connected in parallel with the one or more resistors such that a second voltage across the RC circuit is proportional to a current squared time ($I^2t$) value, and a load voltage detection circuit that measures a load voltage between the input power terminal and the output power terminal. The control device automatically turns the power switching circuit "OFF" whenever the load current exceeds a first value or the current squared time value exceeds a second value or an "OFF" signal is received from the one or more isolated data interfaces, and automatically turns the power switching circuit "ON" whenever an "ON" signal is received from the one or more isolated data interfaces.

The present invention also provides a method for controlling a power from a power supply to a load by providing a power controller that includes an input power terminal, an output power terminal, a power switching circuit connected between the input power terminal and the output power terminal, a detection circuit connected to the power switching circuit, one or more data interfaces, a control device connected to the power switching circuit, the detection circuit and the one or more data interfaces, and wherein the power controller is series connected between the power supply and the load using the input power terminal and the output power terminal. A load current and a current squared time ($I^2t$) value between the input power terminal and the output power terminal are measured using the detection circuit. The power switching circuit is automatically turned "OFF" using the control device whenever the load current exceeds a first value or the current squared time value exceeds a second value or an "OFF" signal is received from the one or more data interfaces. The power switching circuit is automatically turned "ON" using the control device whenever an "ON" signal is received from the one or more data interfaces.

Certain embodiments may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention. For example, the present invention is described with respect to gene sequence data. The present invention, however, is not limited to gene sequence data or the specific design examples described herein.

To facilitate the understanding of this invention, a number of terms are defined below. Terms defined herein have meanings as commonly understood by a person of ordinary skill in the areas relevant to the present invention. The terminology herein is used to describe specific embodiments of the invention, but their usage does not delimit the invention, except as outlined in the claims.

The Micropac IPC is the next generation Power Controller incorporating circuit breaker functionality with current squared time limit ($I^2t$) and load current trip capability. Triac based solid state switches have held the market for automated power control for 50 years. Now with the development of advanced semiconductor MOSFET technology power controllers can be built with high power drive that are able to not only automatically shut down on $I^2t$ current limits and overload currents, but protect the system components, loads and control equipment at the same time. This allows automatic shut-downs avoiding irreparable damage before it has occurred. This adds service life and cuts cost of operation.

The present invention provides the following non-limiting benefits: (1) high input and output isolation that allows high voltages between the input and output greater than 500 volts; (2) remote control of IPC; (3) remote monitoring of IPC status and current; (4) remote monitoring of IPC thermal conditions; (5) expandable architecture that includes multi-functional circuits, including (a) a microprocessor, (b) radio frequency functions, (c) MEMS functionality, (d) thermal sensing and reporting functionality, (e) signal conditioning, (f) external device drivers, (g) power dissipated at the load, and (h) power dissipated by the controller; (6) packaging can be encapsulated; and (7) no output clamping circuitry is required for the AC controller, and output clamping circuitry may be required for the DC controller. When turning off, the shut down time is slow and the turn-off currents are small as they go to zero. The non-linear properties of the output power FETs are used in a precise and controlled manner.

Figure 1:
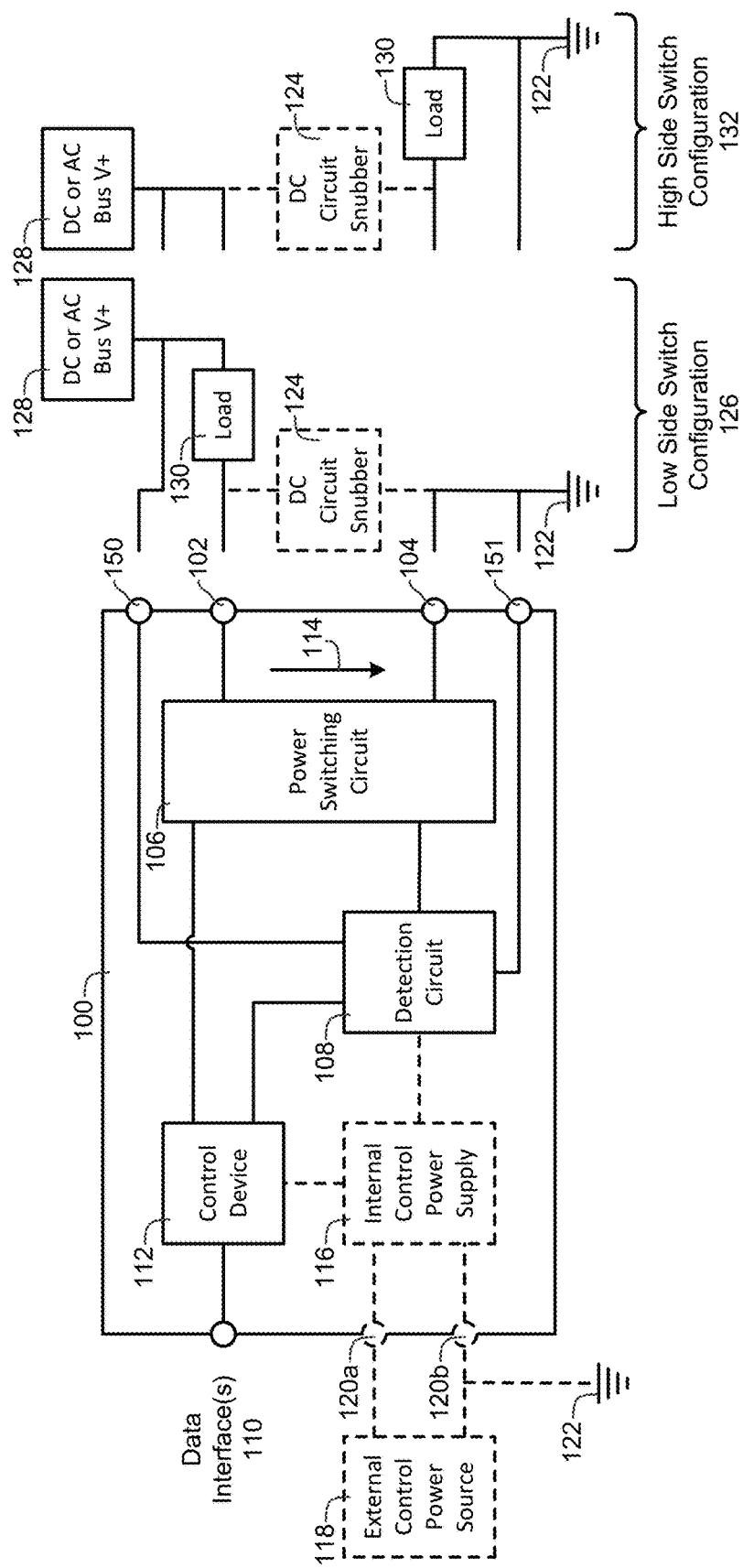
FIG. 1 illustrates a block diagram of a power controller in accordance with one embodiment of the present invention.

Now referring to FIG. 1, a power controller in accordance with one embodiment of the present invention is shown. The power controller 100 includes an input power terminal 102, an output power terminal 104, a power switching circuit 106 connected between the input power terminal 102 and the output power terminal 104, a detection circuit 108 connected to the power switching circuit 106, one or more data interfaces 110, and a control device 112 connected to the detection circuit 108. The one or more data interfaces 110 can be an analog communications interface or a digital communications interface. Moreover, the one or more data interfaces can be an optical coupling device, a display, a keyboard, one or more buttons, one or more selector switches, or any other desirable input and/or output device. The detection circuit 108 measures a load current 114 and a current squared time ($I^2t$) value between the input power terminal 102 and the output power terminal 104. The control device 112 automatically turns the power switching circuit 106 "OFF" whenever the load current 114 exceeds a first value or the current squared time value exceeds a second value or an "OFF" signal is received from the one or more data interfaces 110, and automatically turns the power switching circuit 106 "ON" whenever an "ON" signal is received from the one or more data interfaces 110. The power switching circuit 106 can include one or more field-effect transistors (e.g., MOSFETs, etc.) or other switching device having the desired operating characteristics. The power controller 100 can include an internal control power supply 116 (e.g., an isolated control power supply, batteries, etc.) to the detection circuit 108 and the control device 112. The power controller 100 can also include an external control power source 118 connected to the power controller 100 via one or more external control power source terminals 120. The one or more external control power source terminals 120a and 120b can be connected to the internal control power supply 116 or to the detection circuit 108 and control device 112. One of the external control power source terminals 120b will typically connected to a ground 122.

The power controller 100 provides circuit breaker functionality with various and appropriate snubber circuits 124 (optional) for application protection from being damaged or being in a "stuck-on" condition. The power controller 100 can be configured for either AC or DC voltage sources. For example, the power controller 100 can be an AC power controller having a rated operating voltage of 0 to 280 VAC, or a DC power controller having a rated operating voltage of 0 to 400 VDC. Other ratings are possible. Whenever the power controller 100 is used as a low side switch (low side switch configuration 126), the AC or DC bus voltage 128 is connected to a load 130, which is connected to the input power terminal 102. The output power terminal 104 is connected to ground 122. Whenever the power controller 100 is used as a high side switch (high side switch configuration 132), the AC or DC bus voltage 128 is connected to the input power terminal 102. The load 130 is series connected between the output power terminal connection 104 and the ground 122. The loads can be applied with many options, which may include resistive only, resistive with series or parallel inductance, resistive in series with inductance and capacitance, and combinations of each.

The control device 112 can include one or more processors, a control circuit, or a combination thereof. The one or more processors can be programmable, configurable or externally monitored, configured or controlled using data interfaces 110. For example, the one or more data interfaces 110 can provide a remote control and monitoring of the power controller 100, a status of the power controller 100, a measurement of a current passing between the input power terminal 102 and the output power terminal 104 to a remote device, power dissipated by the remote load, power dissipated by the power controller 100, or a measurement of one or more thermal conditions of the power controller 100 to a remote device. Moreover, the one or more processors can include one or more device drivers to interface with one or more plug-and-play internal or external devices. The control device 112 can also communicate with remote devices via a power line signaling circuit, a wireless transceiver connected to an antenna, or other communication techniques.

The detection circuit 108 can include any number of circuits and sensors necessary to provide additional functionality beyond the above-described circuit breaker functionality. For example, the detection circuit 108 can include a thermal sensor, a thermal shutdown circuit, a smoke sensor, a ground fault detector, a combination thereof, or any other desirable sensor or detection circuit. In one embodiment, the detection circuit 108 measures the load current by monitoring a first voltage across one or more resistors connected between the power switching circuit 106 and one of the power terminals 102 and 104. The first voltage is proportional to the load current. The detection circuit 108 measures the current squared time value by monitoring a second voltage across a RC circuit connected in parallel with the one or more resistors. The second voltage is proportional to the current squared time value. In another embodiment, the detection circuit 108 includes a fault latch circuit and a timer circuit. The detection circuit 108 can also include a voltage detection circuit that measures a load voltage for low side switching 150, and load voltage for high side switching 151. In such a case, power dissipated by the remote loads and power dissipated by the power controller 100 can be determined.

Figure 2:
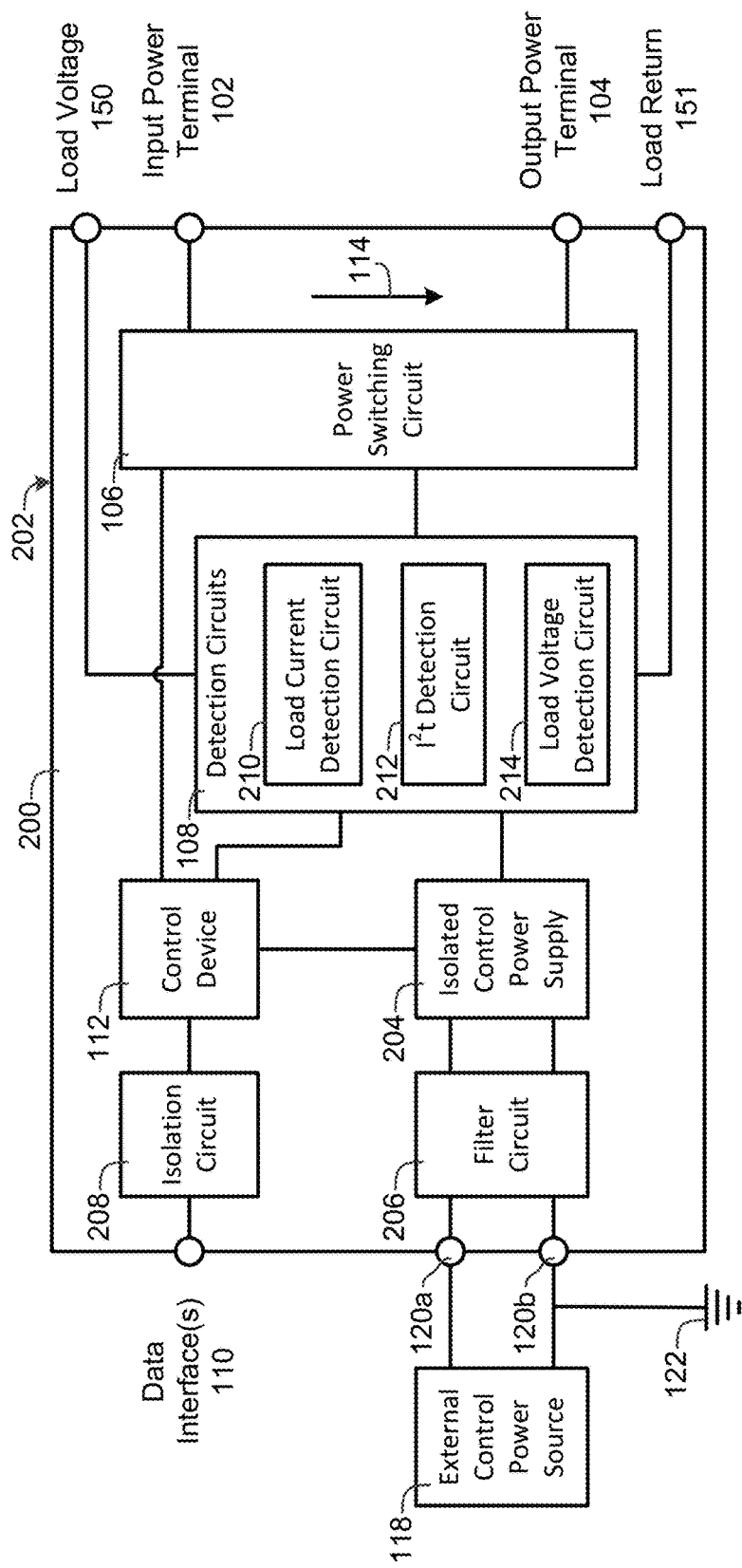
FIG. 2 illustrates a block diagram of a power controller in accordance with another embodiment of the present invention.

Referring now to FIG. 2, a power controller 200 in accordance with another embodiment of the present invention is shown. The power controller 200 includes an enclosure 202 having an input power terminal 102, an output power terminal 104, one or more isolated data interfaces 110, and one or more external control power source terminals 120 accessible from an exterior of the enclosure 202. The enclosure 202 can be encapsulated, shielded or otherwise protected against environmental, electrical and magnetic factors. The power switching circuit 106, detection circuit 108, control device 112, isolated control power supply 204, filter circuit 206 and isolation circuit 208 are disposed within the enclosure 202. The power switching circuit 106 is connected between input power terminal 102 and output power terminal 104. The detection circuit 108 measures a load current 114 and a current squared time ($I^2t$) value between the input power terminal 102 and the output power terminal 104. The detection circuit 108, which includes a load current detection circuit 210, an $I^2t$ detection circuit 212, and a load voltage detection circuit 214, is connected to power switching circuit 106. The control device 112 is connected to power switching circuit 106, detection circuit 108 and isolation circuit 208. The isolation circuit 208 is connected to the one or more data interfaces 110. The one or more data interfaces 110 can be an analog communications interface or a digital communications interface. Moreover, the one or more data interfaces can be an optical coupling device, a display, a keyboard, one or more buttons, one or more selector switches, or any other desirable input and/or output device. The isolated control power supply 204 is connected to at least the control device 112 and detection circuit 108. The filter circuit 206 is connected between the external control power source terminals 120a and 120b, and the isolated control power supply 204. In this embodiment, the power controller 200 is connected to an external control power source 118 via one or more external control power source terminals 120. One of the external control power source terminals 120b will typically connected to a ground 122.

The load current detection circuit 210 includes one or more resisters connected between the power switching circuit 106 and one of the power terminals 102 or 104 such that a first voltage across the one or more resistors is proportional to a load current. The $I^2t$ detection circuit 212 includes a RC circuit connected in parallel with the one or more resistors such that a second voltage across the RC circuit is proportional to the current squared time ($I^2t$) value. The load voltage detection circuit 214 measures a load voltage between the input power terminal 102 and the output power terminal 104. The control device automatically turns the power switching circuit "OFF" whenever the load current exceeds a first value or the current squared time value exceeds a second value or an "OFF" signal is received from the one or more isolated data interfaces, and automatically turns the power switching circuit "ON" whenever an "ON" signal is received from the one or more isolated data interfaces. Note that the detection circuit 108 can include any number of additional circuits and sensors necessary to provide additional functionality beyond the above-described circuit breaker functionality. For example, the detection circuit 108 can include a thermal sensor, a thermal shutdown circuit, a smoke sensor, a ground fault detector, a combination thereof, or any other desirable sensor or detection circuit. The detection circuit 108 can also include a voltage detection circuit that measures a load voltage for low side switching 150, and load voltage for high side switching 151. In such a case, power dissipated by the remote loads and power dissipated by the power controller 100 can be determined.

The control device 112 can include one or more processors, a control circuit, or a combination thereof. The one or more processors can be programmable, configurable or externally monitored, configured or controlled using data interfaces 110. For example, the one or more data interfaces 110 can provide a remote control and monitoring of the power controller 200, a status of the power controller 200, a measurement of a current passing between the input power terminal 102 and the output power terminal 104 to a remote device, or a measurement of one or more thermal conditions to a remote device. Moreover, the one or more processors can include one or more device drivers to interface with one or more plug-and-play internal or external devices. The control device 112 can also communicate with remote devices via a power line signaling circuit, a wireless transceiver connected to an antenna, or other communication techniques.

As previously described in reference to FIG. 1, the power controller 200 provides circuit breaker functionality with various and appropriate snubber circuits 124 (optional) for application protection from being damaged or being in a "stuck-on" condition. The power controller 200 can be configured for either AC or DC voltage sources. For example, the power controller 200 can be an AC power controller having a rated operating voltage of 0 to 280 VAC, or a DC power controller having a rated operating voltage of 0 to 400 VDC. Other ratings are possible.

Figure 3:
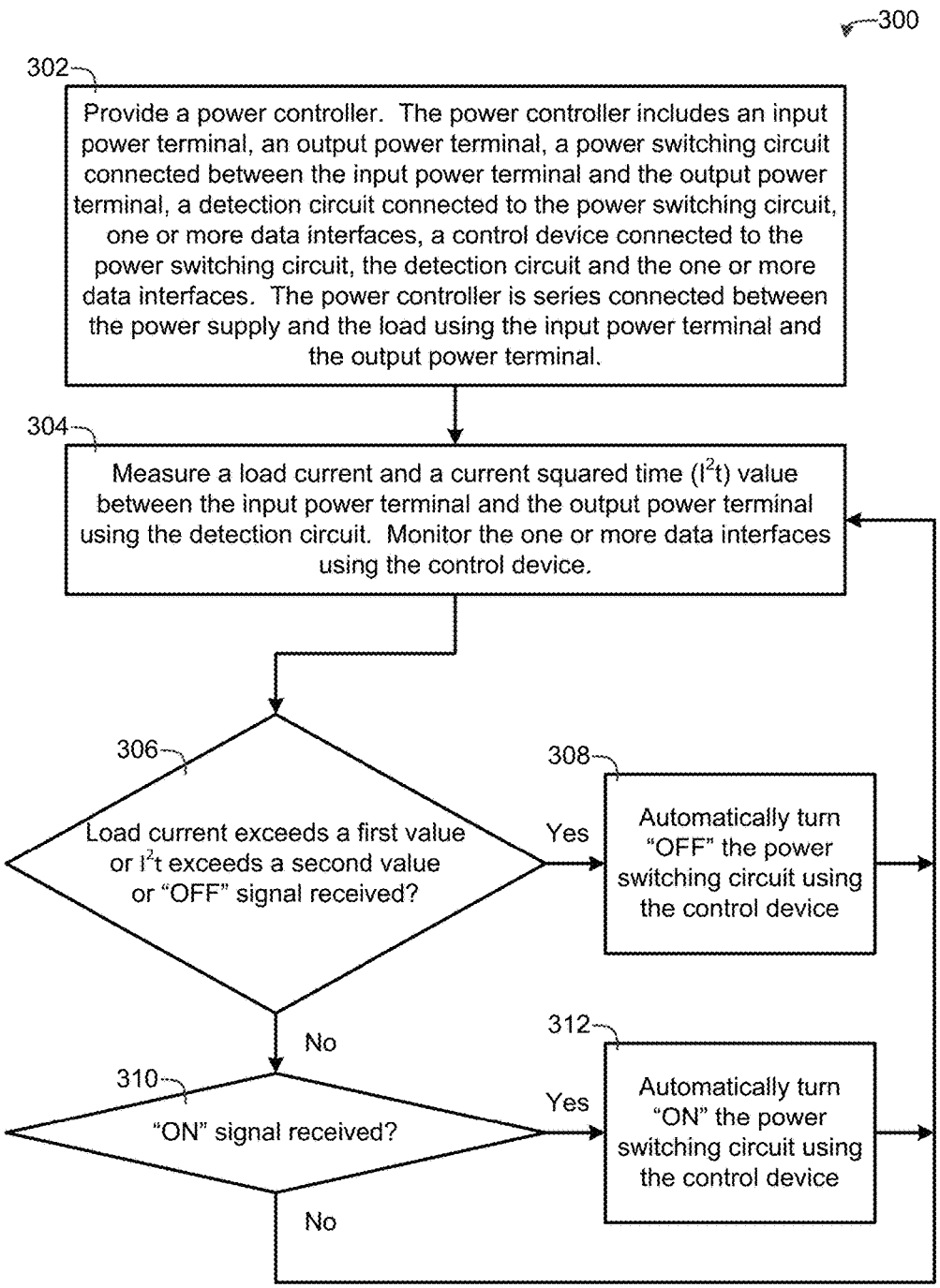
FIG. 3 illustrates a flow chart of a method for controlling a power from a power supply to a load in accordance with one embodiment of the present invention.

Now referring to FIG. 3, a flow chart illustrating a method 300 for controlling a power from a power supply (FIG. 1, 128) to a load (FIG. 1, 130). A power controller (any embodiment described herein) is provided in block 302. The power controller includes an input power terminal, an output power terminal, a power switching circuit connected between the input power terminal and the output power terminal, a detection circuit connected to the power switching circuit, one or more data interfaces, a control device connected to the power switching circuit, the detection circuit and the one or more data interfaces. The power controller is series connected between the power supply and the load using the input power terminal and the output power terminal. A load current and a current squared time ($I^2t$) value between the input power terminal and the output power terminal are measured using the detection circuit, and the one or more data interfaces are monitored using the control device in block 304. If the load current exceeds a first value or the current squared time value exceeds a second value or an "OFF" signal is received from the one or more data interfaces, as determined in decision block 306, the power switching circuit is automatically turned "OFF" using the control device in block 308 and the process loops back to block 304 and repeats the process as described. If, however, the load current does not exceed a first value and the current squared time value does not exceed a second value and an "OFF" signal is not received from the one or more data interfaces, as determined in decision block 306, and an "ON" signal is received from the one or more data interfaces, as determined in decision block 310, the power switching circuit is automatically turned "ON" using the control device in block 312 and the process loops back to block 304 and repeats the process as described. If, however, an "ON" signal is not received from the one or more data interfaces, as determined in decision block 310, the process loops back to block 304 and repeats the process as described.

In another embodiment, the detection circuit also includes a voltage detection circuit that measures a load voltage in block 304. The method 300 can also include the steps of providing a remote control and monitoring of the power controller using the one or more data interfaces, providing a status of the power controller using the one or more data interfaces, providing a measurement of a current passing between the input power terminal and the output power terminal to a remote device using the one or more data interfaces, or providing a measurement of one or more thermal conditions to a remote device using the one or more data interfaces. As previously described other operational values and characteristics can be monitored and used to turn the power switching circuit "ON" or "OFF" or provide data, alerts, messages and other information to and from other devices.

Figure 4:
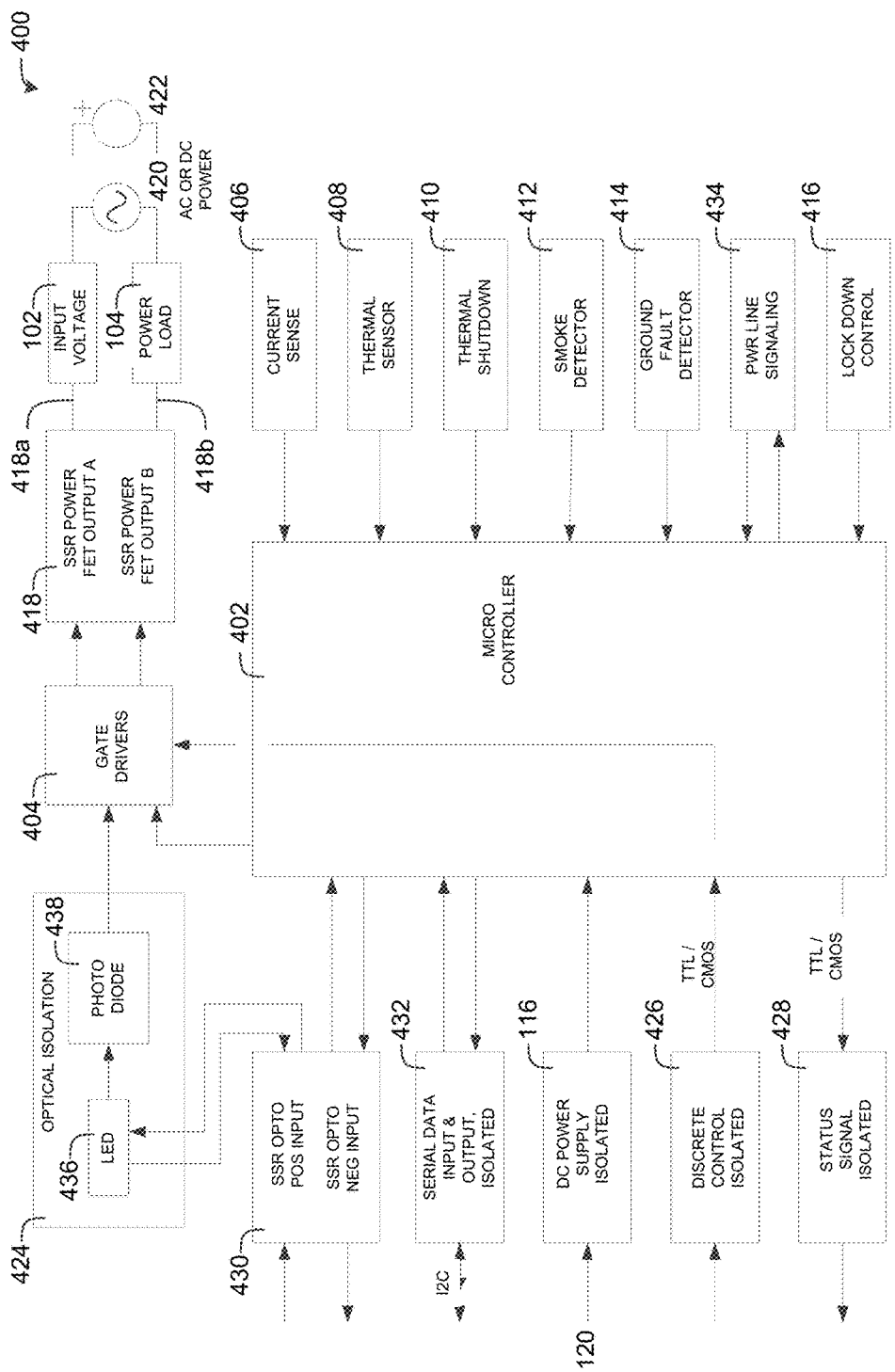
FIG. 4 illustrates a block diagram of a power controller in accordance with another embodiment of the present invention.

Referring now to FIG. 4, a block diagram of a power controller 400 in accordance with the present invention is shown. As previously described, the power controller 400 includes a control device, a detection circuit, a power switching circuit, an isolated control power supply, one or more data interfaces, one or more external control power source terminals, an input power terminal and an output power terminal. As shown the control device includes microcontroller 402 and gate drivers 404 (also referred to as a fault latch circuit). The detection circuit includes current sense circuit 406, thermal sensor 408, thermal shutdown circuit 410, smoke detector 412, ground fault detector 414 and lock down control 416. The power switching circuit includes SSR Power FETs 418 in which SSR Power FET Output A 418a is connected to input voltage 102 and SSR Power FET Output B 418b is connected to power load 104. The input voltage 102 and power load 104 connections or terminals are then connected to either an AC power source 420 or a DC power source 422. The gate drivers 404 control the SSR Power FETs 418 based on control signals received from the optical isolation circuit 424, microcontroller 402, and the isolated discrete control 426 via microcontroller 402 and the isolated status signals 428 via microcontroller. The isolated DC power supply 116 is connected to the microcontroller 402 and one or more external control power source terminals 120. Other input/output signals or data are communicated via the SSR opto terminals 430 connected to the microcontroller 402 and the optical isolation circuit 424, isolated serial data input and output 432 connected to the microcontroller 402, and power line signaling 434 connected to the microcontroller 402. The functions of the power controller 400 are performed through the operation of a microprocessor or a discrete controller 402. The microcontroller 402 preferably uses state-of-the-art semiconductor devices such as CPLD or FPGA types and is used for monitoring only.

The current sensor 406 monitors the current and provides data to the microprocessor 402 to assure total protection from damaging failure modes. The thermal sensor 408 monitors the temperature of the heat producing parts of the power controller 400 and provides data to the microcontroller 402. The thermal profiles that are safe are distinguished from those that are harmful, and thus the power controller 400 is protected along with its loads. Thermal information is also communicated from the power controller 400 to an external location for reporting only or acted upon with user discretion. The thermal shutdown circuit 410 forces the power switches 418 into an open position whenever the temperature within the power controller 400 exceeds a safe level. This condition is communicated for monitoring. The smoke detector 412 is optional and connected to a buffered port on the microcontroller 402 for action and for monitoring. The ground fault detector 414 uses a tie point to monitor the ground relation and takes appropriate action when a fault is detected. The relationship between the two power terminals entering the power controller 400 and earth or protective ground are of great importance to proper and reliable operation of the power controller 400. With a tie point, the ground relation is monitored and appropriate action is taken when there is a fault detected. The action taken is programmed into the microcontroller 402. The power line signaling interface 434 is available using the Texas Instruments PLC, Power Line Communication. Control and monitoring of the power controller 400 can be performed in a reliable way without depending on wireless methods. The lock down control circuit 416 provides a mechanical disconnect when there is a condition that requires power to be turned "OFF" unconditionally. Output device leakage issues are avoided. Options include techniques for allowing the power controller 400 to be turned "ON".

The positive and negative inputs of the SSR opto terminals 430 are isolated and are fed to the microcontroller 402 and fed directly to the LED 436, which provides performance flexibility. The isolated serial data interface 432 includes input and output connectors that provide a serial communication link has the $I^2C$ functions. The DC control power supply 116 derives power from external DC with magnetic isolation. It powers the microcontroller 402 and its sensors and detection circuits, gate drivers 404 and other components as needed. The discrete control connector 426 provides an external signal control path that is converted into a TTL or CMOS bidirectional signal set to an internal processor or controller. The control signals are buffered to prevent damage. The isolated status signal connector 428 provides an external signal set is OUTPUT ONLY and is buffered and converted to the processor or controller circuits.

One or more optocouplers 424 can be connected between the SSR opto terminals 430 and the gate drivers 404. Each optocoupler 424 may include a light emitting diode (LED) 436 and a photodiode or photodetector 438. The LED 436 produces light that is directed to the photodiode or photodetector 438 and reflected, focused, and collimated in the opto-isolated path to the photodiode or photodetector 438. The photodiode or photodetector 438 receives the near total light from the LED 436 and produces a corresponding DC voltage for the transistor gate drivers 404.

Figure 5:
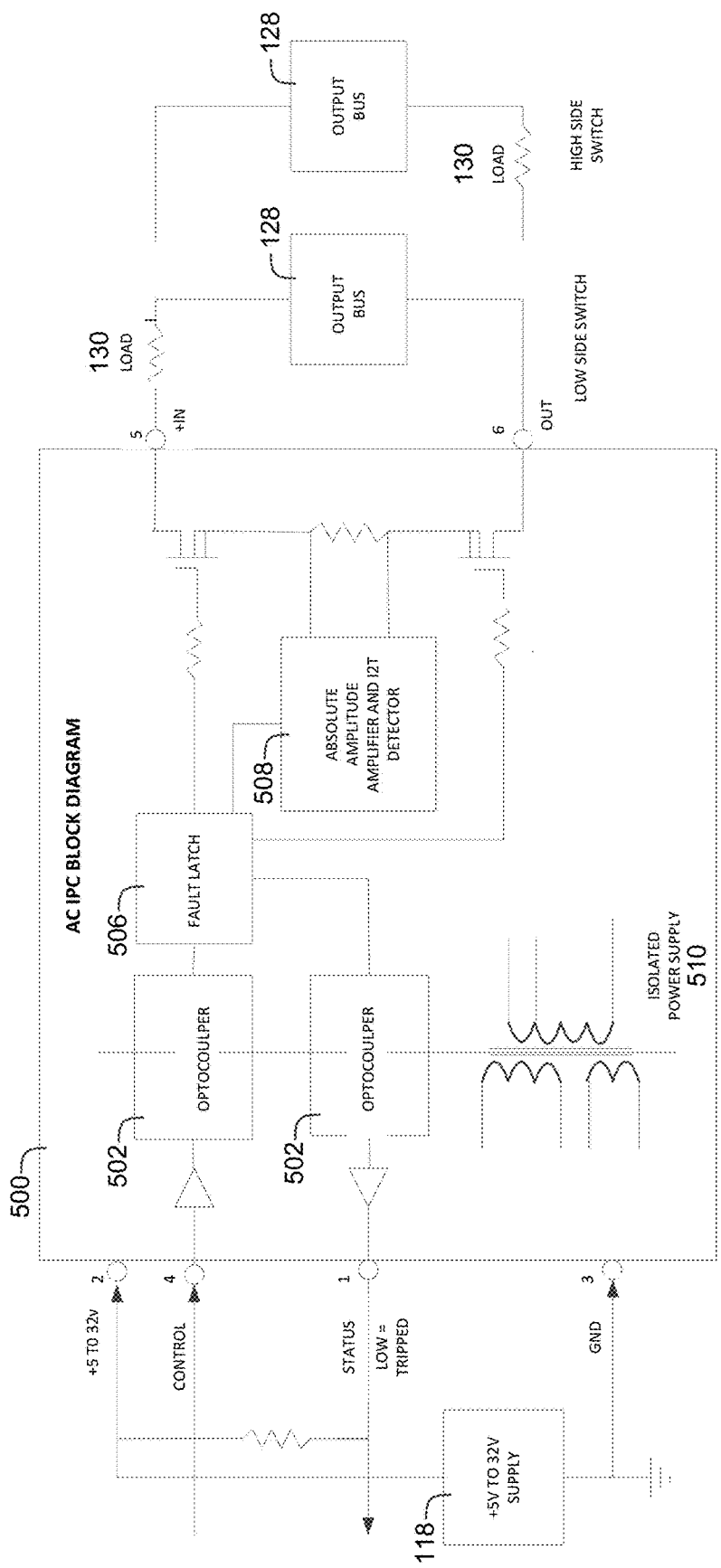
FIG. 5 illustrates a block diagram of a power controller in accordance with another embodiment of the present invention.
Figure 6:
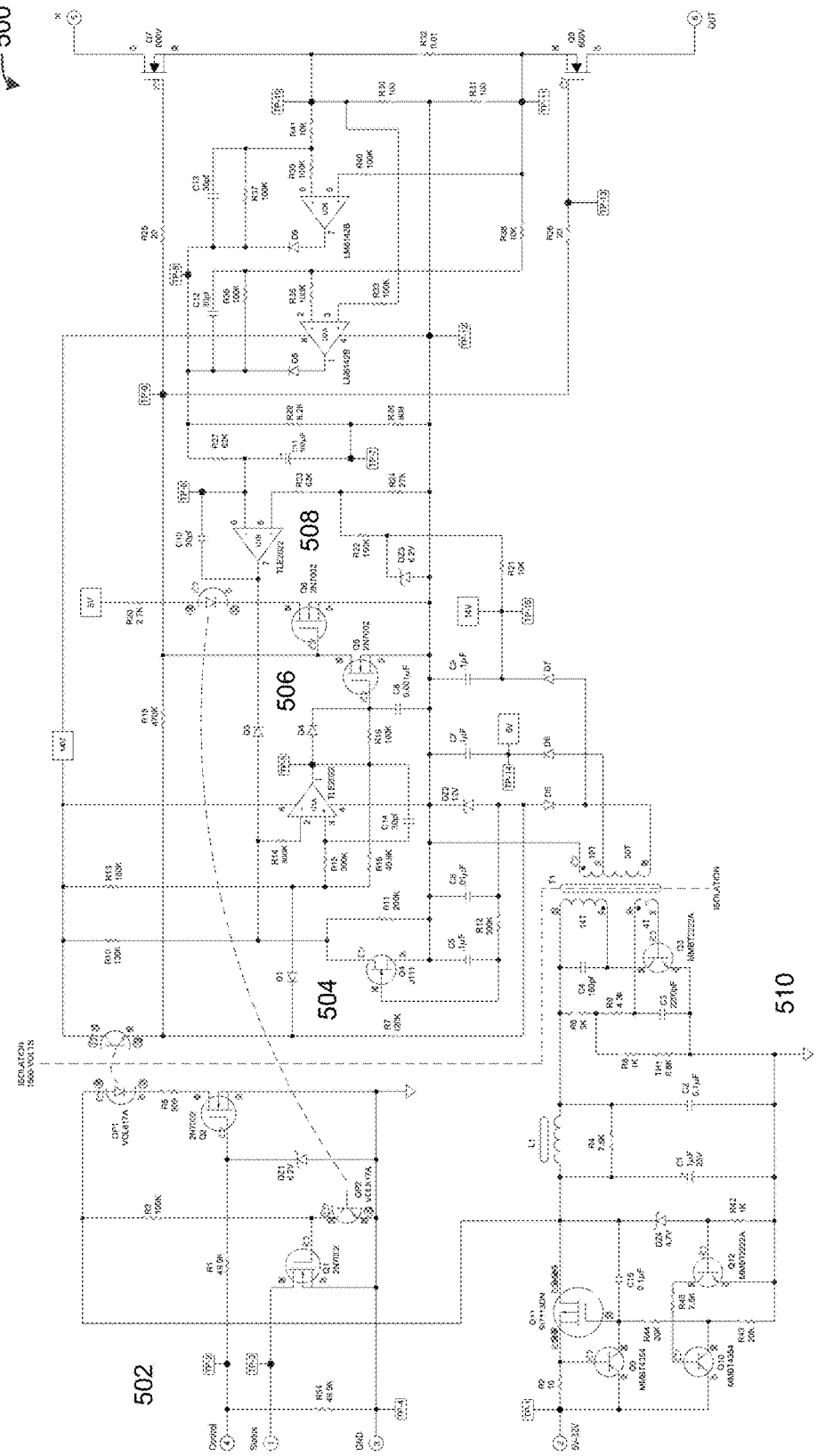
FIG. 6 illustrates a schematic diagram of a power controller in accordance with another embodiment of the present invention.

Referring now to FIGS. 5 and 6, a block diagram and schematic diagram of a power controller 500 in accordance with another embodiment of the present invention is shown. The power controller 500 includes an input section 502, a timer section 504, a fault section 506, a current detection section 508 and a power section 510. The input section 502 is a control and status circuit with main components Q1 and Q2. The timer section 504 is a start circuit with main component Q4. The fault section 506 is a fault latch circuit having a main component U1A. The current detection section 508 is an $I^2t$ and instant trip circuit having main component U1B. The power section 510 is an isolated power supply having main components Q3 and T1.

The input section 502 is made up of the +5 VDC power section, status output, control input section and connection terminals. The +5 VDC power section is where the input power for operation of the power controller is connected. The +5 VDC is connected to Pin 2 and the 5 volt return (GND) is connected to Pin 3. The status output is connected to the input section at Pin 1. Transistor Q1 is the open collector driver for the status line. This line is held high by an external pull-up resistor between Pins 1 the Status terminal and Pin 2 the +5 VDC terminal. Should the connecting equipment have an internal pull-up in its Status input connection no external pull-up will be required. The control input is connected to Pin 4 of the input section and is held to a logic level low anytime the control input terminal is left open for any reason. The Q2 transistor is protected from over voltage by resistor R1 and zener diode DZ1.

The fault latch and start circuit share components to achieve multiple functions and are difficult to separate for discussion purposes. The fault latch and start circuit is powered by +14 volts and −12 volts generated by the isolated control power supply. The transistor of the optical isolator OP1 and resistor R7 generate the gate drive for the power switching MOSFETs Q7A and Q7B, and the fault latch signals for comparator U1A. Anytime the optical isolator OP1 transistor is on D1 cathode, D2 cathode, and resistor R18 are at approximately +14 volts. When the transistor of OP1 is off, the voltage will approximate zero volts. The optical isolator OP1 controls the power MOSFET switching of the DC IPC or the AC IPC units in the same manner.

The start and stop timer function of the IPC is generated by using an RC time constant generated by capacitor C5 and resistor R12. The uni-junction field effects transistor (JFET) Q4 initializes to an "ON" state at power up holding the fault latch comparator negative input at ground level until the time constant of R12 and C5 charges to completion and Q4 is allowed to turn "OFF". The U1A fault latch is forced "ON". This sequence prevents the IPC output from turning on at initial power up independent of the state of the control line input.

Resistors R10 and R11 generates a reference threshold voltage at the fault latch U1A-6. The condition after initial power is applied of the fault latch input is level at +input U1A-5 is higher than the reference level on the −input at U1A-6 holding the latch "ON". For a controlled power-up, the fault latch is set to "OFF" using the IPC the Control input by first setting the control low. This action insures the optical isolator transistor OP1 is "OFF" forcing the fault latch output to be high and the power switching MOSFETs Q7A and Q7B "OFF". Setting the control input high turns on the optical isolator transistor OP1 "ON" turning the Fault latch "OFF" and turning on the unit.

During normal operation the fault latch is UA1-7 is low and remains low during the controlled power down sequence. When the optical isolator transistor OP1 is turned "OFF", D 1 keeps the −input at UA1-5 input from becoming lower than the fault latch +input UA1-6 allowing R7, R17, R18, and D2 to turn the power MOSFETs "OFF" softly. The DC IPC or the AC IPC units in the same manner.

The $I^2t$ and instant trip detector circuit is a combination of the $I^2t$ comparison network with the Instant trip network. Trip curves meets requirements of MIL-STD_1760E. Near the output of the schematic, the component marked U1B is the $I^2t$/instant trip detector circuit. Resistor R21 and R22 from a voltage divider that is the source for zener diode DZ3. This circuit generates a pre-reference that connects to a second voltage divider used to complete the reference circuit at +input of U1B pin 3 for the $I^2t$/Instant trip detector circuit.

Resistor R32 is the output current sense resistor for the IPC's $I^2t$/instant trip detector, the voltage developed across R32 is proportional to the current passing through the IPC output. This reference voltage is constantly being compared to the voltage developed by resistors R29 and R28 and is used to set the instant trip point voltage. This circuit allows the comparator U1B to generate a logic low level signal on output pin 1 when the current through the IPC switch equals or exceeds the $I^2t$ reference voltage. The $I^2t$ reference voltage is generated by the time constant created by RC network formed with capacitor C11 and resistor R27. Both the $I^2t$ and the instant trip inputs are summed at U1B pin 2 the −input of the comparator.

The IPC AC and DC units are powered by an external +5 VDC connected to the input section. The input power is routed through the input filter and supplies power to Q3 blocking oscillator circuitry shown in the lower right part of the schematic. Resistor R2 limits inrush current at start-up on the +5V input. Components inductor L1, resistor R4, capacitor C1 and C2 are connected to form a pi-filter to reduce conducted emissions onto the +5V power line. The blocking oscillator is designed to operate at near 1 MHz at 10% duty cycle. The oscillator output is then converted through a multi-winding transformer with tapped output windings. The isolated output is conditioned to generate voltage of +14 volts, +5 volts and −12 volts to be used by the internal fully isolated circuitry.

For AC operation, the two MOSFETs are connected in series as a common source configuration, drains offered to the output providing IPC voltage blocking in both load polarities. A common sense resistance in the source path, externally referenced, provides input to an absolute amplifier. The absolute amplifier output is a "rectified" output voltage whose voltage is a function of load current in each polarity. This signal feeds the $I^2t$ network and detector as in the DC IPC. Low Power AC IPCs, 5 A at 280V RMS, high power factor, to 500, stored inductive energy is managed by controlled MOSFET turn-off. The inductive current is dissipated within the controlled turn-off time preventing voltage transients normally associated with breaking an inductive circuit. The inductive energy is dissipated in the MOSFET within the capabilities of the IPC. Normal means of load transient voltage control (snubbing and clamping) is minimized by detecting and turning off the IPC just before load current reversal. The result is Inductive transient current control and minimal MOSFET power dissipation.

As a result, the power controller 500 is an integrated optical circuit breaker (IOCb) that provides the following functions: (a) a photo diode and detector; (b) the power FET or FETs that are in series with the load; (c) a sensor that monitors the current in the FET; and (d) a control device that receives a logic signal and applies its status to the control of the FET.

Figure 7:
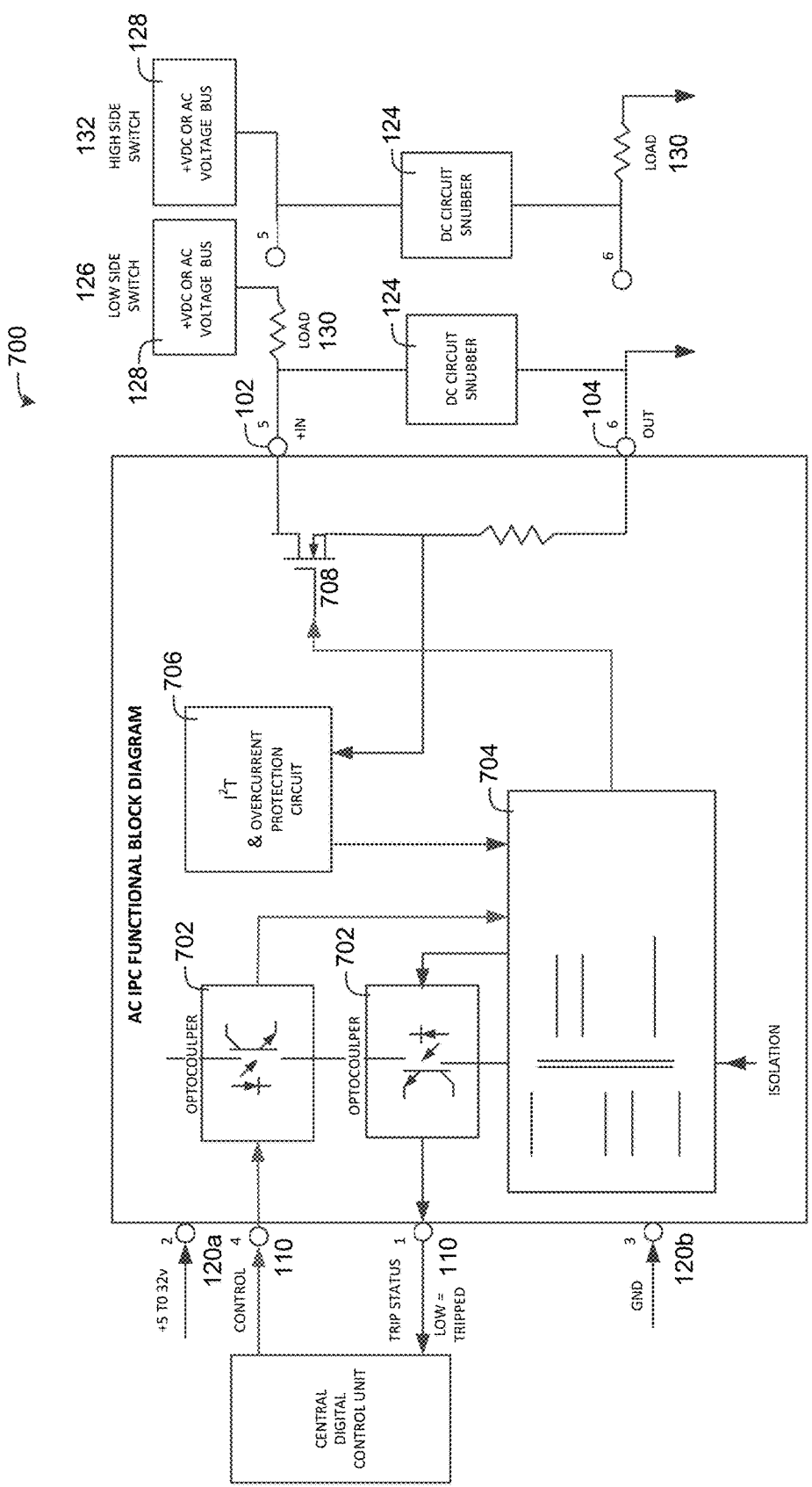
FIG. 7 illustrates a block diagram of a power controller in accordance with another embodiment of the present invention.

Now referring to FIG. 7, a block diagram of a power controller 700 in accordance with another embodiment of the present invention is shown. The power controller 700 includes two optocouplers 702 connected to a transformer isolated control circuit 704. The transformer isolated control circuit 704 is connected to an $I^2t$ and overprotection circuit 706 and an output circuit 708. The $I^2t$ and overprotection circuit 706 is also connected to the output circuit 708. The power controller 700 provides the following features:

All solid-state circuitry, with no moving parts to wear, ensures a long life.
Soft start for reduced EMI.
High efficiency with less than 0.8V drop at full load.
Compact panel mount "Hockey Puck" style package.
No Output current de-rating is required for base plate temperatures of −40° C. to +80° C.
SPST, normally open power controller.
UL94V-0 approved clear IP20 touch safe protection cover.
MIL-STD-704A through E and MIL-STD-1760E $I^2t$ compliant.
TTL/CMOS compatible Switch Status.
AC devices designed for inductive load power factors to 0.75.
AC devices designed with integrated load switching transient suppression.

Figures 8A, 8B:
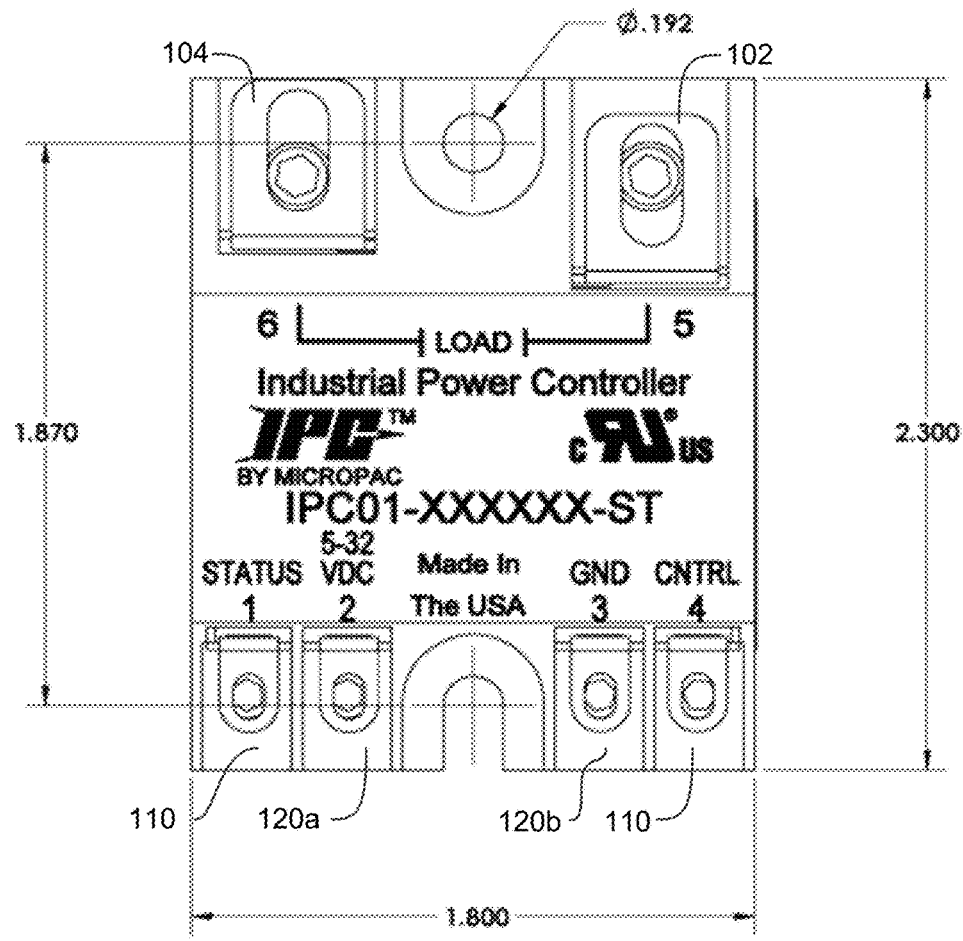
FIGS. 8A-8B illustrate an enclosure of a power controller in accordance with another embodiment of the present invention.

The power controller 700 can be used in the following non-limiting applications: aerospace ground support equipment, industrial and commercial lighting systems, commercial test equipment, manufacturing equipment, energy exploration systems and equipment, communications systems and plants, aircraft and avionics systems, automation equipment, fabrication equipment, vending machines, selective power distribution, laboratory test systems, food processing and others. FIGS. 8A-8B illustrate an enclosure of the power controller 700. All module components are acrylic conformal coated.

The power controller combines both relay and circuit breaker functions. The Isolated IPC is mechanically similar to the standardized industrial Solid State Relay. The functions include soft start load switching, $I^2t$ overload/fault protection that provides circuit breaker function to MIL-STD-1760E and load status signaling indicating switch output conditions of ON, OFF and Overload. Inductive and optical coupling between the input circuits and output provides isolation of 1,500 VRMS. Power MOSFET output switches provide soft start and low ON voltage drop for improved thermal characteristics. The input control logic operates from a $V_{DD}$ of 5 to 32 VDC.

Output current is monitored to control outputs during over-current conditions (see FIGS. 9-12). Over-current conditions include over-load and shorted output during turn-on. Open-collector output status indicates the state of the output switch MOSFET load driver. The output remains "OFF" until the short is removed and the unit's control line is toggled "OFF" and back "ON". Locking the output "OFF" on an error condition prevents damage to the controller and further system damage caused by the short circuit. Output status is an active low (open collector) for controller "OFF" or tripped conditions and high (pull up resistor) for a normally "ON" output state.

TABLE 1

ABSOLUTE MAXIMUM RATINGS

| Description | DC Power Controller | AC Power Controller |
|---|---|---|
| Isolation Voltage | 1,500 VDC | 1,500 VDC |
| Load Voltage | 75/400 V VDC[1,2] | 40/280 VAC RMS |
| Load Current | Less than 8 times rated operating current/self protecting[3] | Self protecting to MIL-STD-760E[3] |
| Bias supply voltage, $V_{DD}$ | −0.6 to 5.5 VDC | −0.6 to 5.5 VDC |
| Control Voltage | 1 Volt above $V_{DD}$/ 1 Volt below Return | 1 Volt above $V_{DD}$/ 1 Volt below Return |
| Operating Temperature, Case | −40° C. to +85° C. | −40° C. to +80° C. |
| Storage Temperature | −55° C. to +85° C. | −55° C. to +85° C. |

Notes:
[1]External snubbing may be required for Power Controller protection.
[2]Reversing output polarity on DC units may cause permanent damage.
[3]The $I^2t$ circuit breaker function terminates AC overloads and fault currents per FIGS. 1 or 2 and DC overloads and fault currents per FIGS. 3 or 4.

TABLE 2

AC ELECTRICAL OUTPUT CHARACTERISTICS: $T_C = -40$ to $85°$ C.

| Description[1] | Units | Device 40 VAC/10 A | Device 280 VAC/5 A |
|---|---|---|---|
| Rated Operating Voltage | $V_{RMS}$ | 0-40 | 0-280 |
| Overvoltage (Maximum) | $V_{RMS}$ | 45 | 310 |
| Transients (Maximum) | $V_{PEAK}$ | 64 | 424 |
| Operating Frequency | Hz | 50-450 | 50-450 |
| Current Rating | $A_{RMS}$ | 10 | 5 |
| Interrupt Current Rating[2,3] | $A_{PEAK}$ | 100 | 50 |
| Turn-On/Turn-Off Time[4] | mSec | 8 | 8 |
| Turn-On/Turn-Off Delay[6] | mSec | 12 | 12 |
| Trip Shutdown Time[3,5] | μSec | 35 | 35 |
| Maximum Off-State Leakage @ Rated Voltage | μA | 500 | 500 |
| Maximum On-State Voltage Drop @ Rated Current | $V_{RMS}$ | 0.75 | 0.75 |
| Maximum On-State Resistance @ Rated Current | Ohms | 0.15 | 0.30 |

Notes:
[1] This is not a "zero crossing Turn-On" IPC. Turn-On at other than zero-crossing will experience a "soft-start" voltage and current equal to the typical Turn-On Rise Time of 8 msec. At 60 Hz this is ½ sin of the normal voltage rise and is 2.5 cycles for 400 Hz.
[2] Steady state trip current is between 120% and 160% of rated current (See FIGS. 9 and 10).
[3] $I^2t$ trip current is time dependent (See FIGS. 9 and 10).
[4] Output of 10 to 90%/90 to 10%.
[5] Output current measured from fault onset to 10% rated load.
[6] "ON" command period is 1 sec minimum with a duty cycle of 10%.

TABLE 3

DC ELECTRICAL OUTPUT CHARACTERISTICS: $T_c = -40$ to $85°$ C.

| Description[1] | Units | Device 75 VDC/10 A | Device 400 VDC/5 A |
|---|---|---|---|
| Rated Operating Voltage | V | 0-75 | 0-400 |
| Transient Overvoltage[1] | $V_{PEAK}$ | 95 | 475 |
| Current Rating | A | 10 | 5 |
| Interrupt Current Rating[2,6] | % | 120 | 160 |
| Turn-On/Turn-Off Time[5,7] | mSec | 6 | 6 |
| Turn-On/Turn-Off Delay[5] | mSec | 10 | 10 |
| Trip Shutdown Time[3,4] | μSec | 35 | 35 |
| Maximum Off-State Leakage @ Rated Voltage | μA | 500 | 500 |
| Maximum On-State Voltage Drop @ Rated Current | V | 0.75 | 0.75 |
| Maximum On-State Resistance @ Rated Current | Ohms | 0.08 | 0.16 |

Notes:
[1] Transient overvoltage exceeding this voltage may result in damage to the device.
[2] Steady state trip current is between 120% and 160% of rated current (See FIGS. 11 and 12).
[3] $I^2t$ trip current is time dependent (See FIGS. 11 and 12).
[4] Output current measured from fault onset to 10% rated load.
[5] "ON" command period is 1 sec minimum with a duty cycle of 10%.
[6] Inductive loads must be suppressed. Fault shutdown can be 51Js.
[7] Output of 10 to 90%/90 to 10%.

TABLE 4

AC AND DC CHARACTERISTICS: $T_c = -40$ to $850°$ C.

| Description | Units | AC and DC Devices |
|---|---|---|
| Maximum Bias supply, $V_{DD}$ | VDC | 32 |
| Maximum Bias current | mA | 35 |
| Maximum Control voltage range[1] (CMOS Configuration) | VDC | $-0.5$ to $\leq V_{DD}$ |
| Minimum Turn-on voltage $(V_{IH})$[2] | VDC | 3.9 |
| Maximum Turn-off voltage $(V_{IL})$[2] | VDC | 2.0 |
| Trip Reset Time[3] | Seconds | 100 |
| Status Supply Voltage (open Collector) | VDC | 32 |
| Status of leakage current | μADC | 4 |
| Status on voltage | VDC | 0.4 |
| Junction temperature | ° C. | 150 |
| Thermal resistance, $\theta_{JC}$ | ° C./W | 5 |
| Output Capacitance | pF | 3,000 |
| Input to Output Capacitance | pF | 25 |

Notes:
[1] Input transitions should be "bounce-less contact" with transitions of <1 msec.
[2] TTL Logic may require a pull-up resistor to ensure a "high" input condition.
[3] The IPC has load current memory. A period of 100 seconds between an overload, or shorted load restart allows for full current startup.

TABLE 5

Short circuit and Status Sequence

| | Shorted at Turn On | | | | | | Shorted while On | | | |
|---|---|---|---|---|---|---|---|---|---|---|
| Input Control | 0 | 1 | 1 | 0 | 1 | 1 | 1 | 1 | 0 | 1 |
| Load Current | 0 | 0 | 0 | 0 | 1 | 1 | 0 | 0 | 0 | 1 |
| Switch Status | 0 | 0 | 0 | 0 | 1 | 1 | 0 | 0 | 0 | 1 |
| Output | Short Applied | Short Applied | Short Removed | Load | Load | Load | Short Applied | Short Removed | Load | Load |

Notes:
1. Unit Powers up in the OFF condition with application of $V_{DD}$. However, it is highly recommended that Control be held low (OFF) during the initiation of Power to ensure there is no transient reset start signaling.
2. Fault Status reports only when $V_{DD}$ is present.
3. An "OFF" Control to "ON" Control transition is required to first turn the Unit On.
4. A loss of $V_{DD}$ will return the output state to "OFF."
5. Truth Table Power sequencing: Output Status open collector pull-up resistor is assigned a separate and always on voltage producing a "1" when "Open."

Pin Designation

| | Pin Designation |
|---|---|
| Pin 1 | Status |
| Pin 2 | +5 to 32 VDC |
| Pin 3 | Input GND |
| Pin 4 | Control |
| Pin 5 | Output (+DC) (~AC) |
| Pin 6 | Output (−DC) (~AC) |

Figure 9:
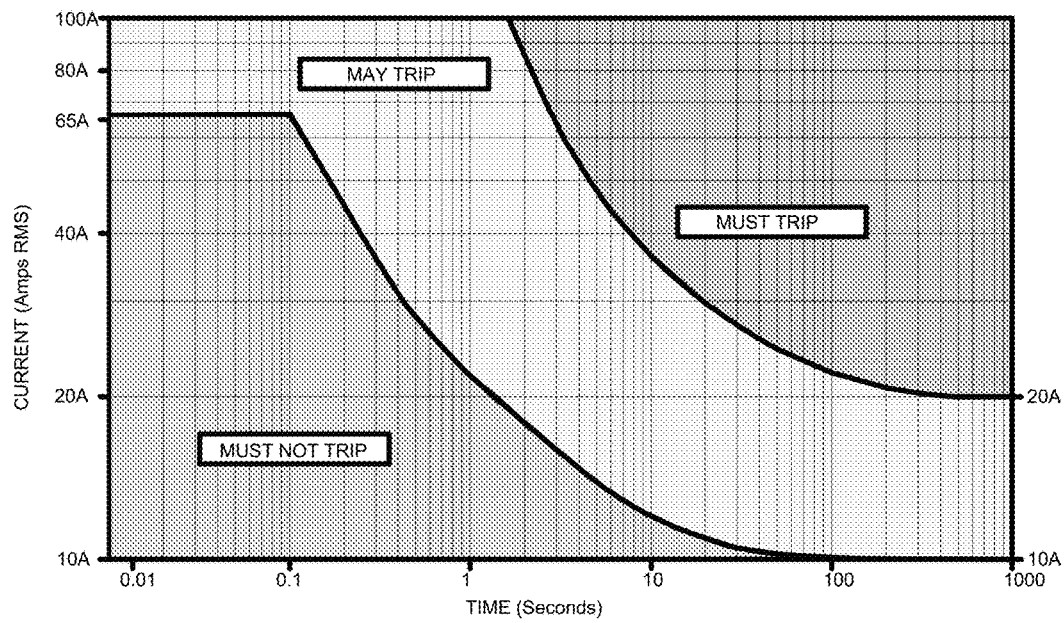
FIG. 9 is a trip curve for a power controller rated at 10 A and 40 VAC in accordance with another embodiment of the present invention.
Figure 10:
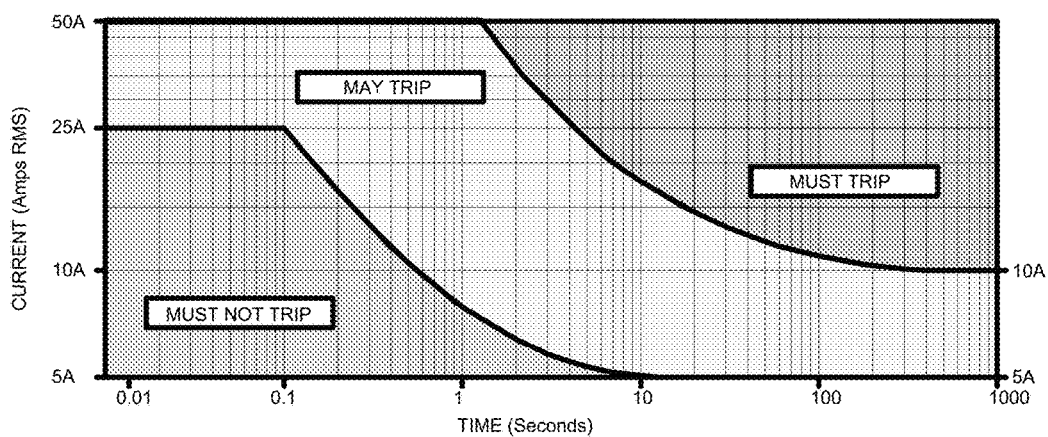
FIG. 10 is a trip curve for a power controller rated at 5 A and 280 VAC in accordance with another embodiment of the present invention.

The trip curves are shown in FIGS. 9-12. FIG. 9 is a trip curve for a power controller rated at 10 A and 75 VDC in accordance with another embodiment of the present invention. FIG. 10 is a trip curve for a power controller rated at 5 A and 400 VDC in accordance with another embodiment of the present invention. The output currents are defined in the Must Trip/May Trip/Must Not Trip regions. Load fault current in the "ON" operating condition is limited by the source and load impedance. The over current and fault trip currents terminate abruptly and may require external "snubbing" or clamping to prevent damage to the IPC.

Figure 11:
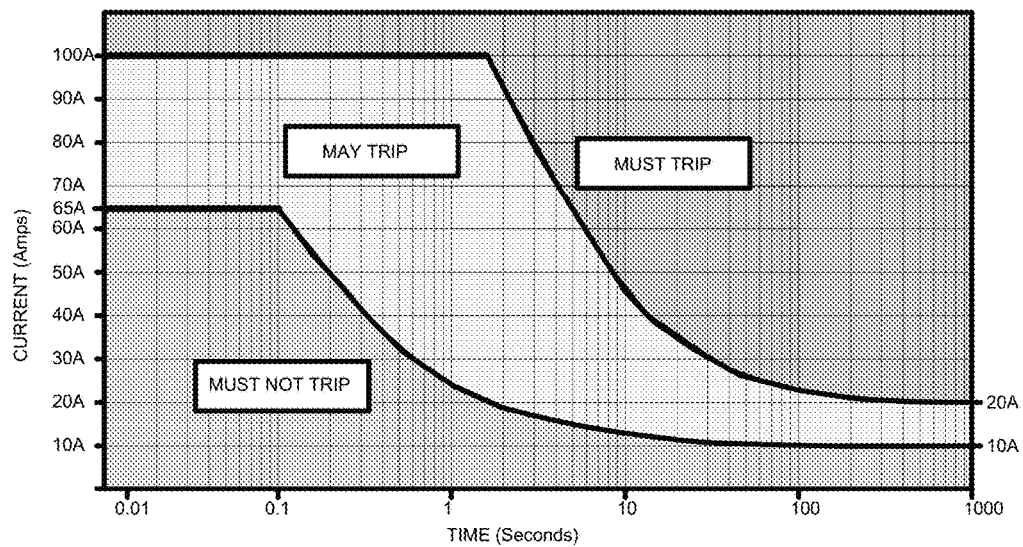
FIG. 11 is a trip curve for a power controller rated at 10 A and 75 VDC in accordance with another embodiment of the present invention.
Figure 12:
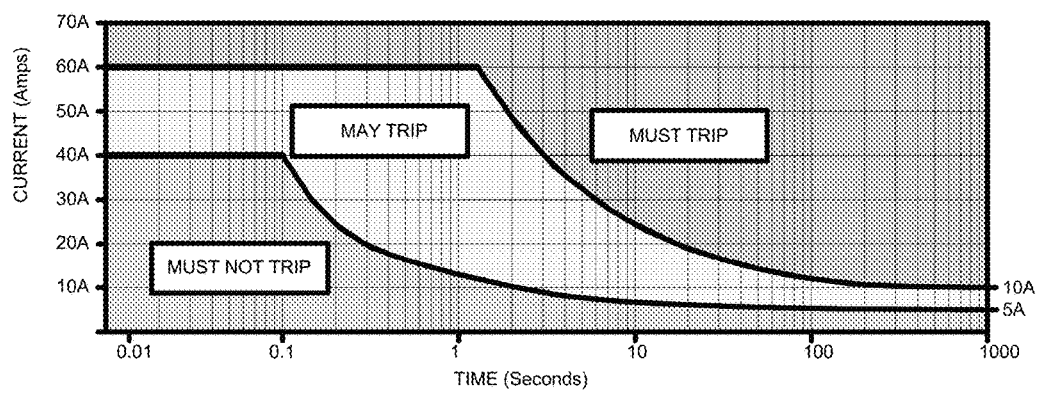
FIG. 12 is a trip curve for a power controller rated at 5 A and 400 VDC in accordance with another embodiment of the present invention.

FIG. 11 is a trip curve for a power controller rated at 10 A and 40 VAC in accordance with another embodiment of the present invention. FIG. 12 is a trip curve for a power controller rated at 5 A and 280 VAC in accordance with another embodiment of the present invention. The output currents are interrupted in the Must Trip/May Trip/Must Not Trip regions similar to MIL-STD-1760E. The load fault current from the "ON" operating condition is limited by the source and load impedance.

Referring back to FIG. 7, The high side (5) or low side (6) switch connections are facilitated by full isolation between input logic, base plate and output switch connects. The logic level control input circuit drives an Opto-Coupler across the isolation to the switch circuits and a second OptoCoupler returns a signal for the Open-collector Status Output. Control (4), status (1), $V_{DD}$ input power 5-32 VDC (2) and GND (3) make up the input isolation group. A filtered DC to DC converter is driven from the input $V_{DD}$ to power the secondary side circuits. The output circuit consists of output MOSFETs connected at their sources through a current sense resistor and their Drains offered as the output switch.

In the DC version, the sense resistor is monitored by the $I^2t$ detection circuit. A fault latch receives inputs from the $I^2t$ detection circuit, the control power supply and the control optocoupler. Based on these inputs the gates of the output MOSFETs are controlled. The fault latch also provides the status signal.

In the AC version, an absolute amplifier rectifies the output current (voltage) of the sense resistor by the $I^2t$ detection circuit. As in the case of the DC version, a fault latch receives inputs from the $I^2t$ detection circuit, the control power supply and the control optocoupler. Based on these inputs the gates of the output MOSFETs are controlled. The fault latch also provides the Status signal.

It may be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications, patents and patent applications mentioned in the specification are indicative of the level of skill of those skilled in the art to which this invention pertains. All publications, patents and patent applications are herein incorporated by reference to the same extent as if each individual publication, patent or patent application was specifically and individually indicated to be incorporated by reference.

Terms such as "a", "an," and "the" are not intended to refer to only a singular entity, but include the general class of which a specific example may be used for illustration. In addition, the use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it may be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A power controller comprising:
an input power terminal;
an output power terminal;
a power switching circuit comprising a first power field-effect transistor having a drain connected to the input power terminal and a gate connected to a control device, and a second power field-effect transistor having a gate connected to the control device and a source connected to the output power terminal;
a detection circuit connected to the power switching circuit that measures a load current and a current squared time ($I^2t$) value between the input power terminal and the output power terminal, wherein the detection circuit comprises:
one or more resistors connected in series between a source of the first power field-effect transistor and a drain of the second power field effect transistor, such that a first voltage across the one or more resistors is proportional to the load current, and
a RC circuit connected in parallel with the one or more resistors such that a second voltage across the RC circuit is proportional to the current squared time value;
one or more data interfaces; and
the control device connected to the power switching circuit, the detection circuit and the one or more data interfaces that automatically turns the power switching circuit "OFF" whenever the load current exceeds a first value or the current squared time value exceeds a second value or an "OFF" signal is received from the one or more data interfaces, and automatically turns the power switching circuit "ON" whenever an "ON" signal is received from the one or more data interfaces.

2. The power controller as recited in claim 1, wherein the first value and the second value are set in accordance with a "Must Not Trip" curve and a "Must Trip" curve, wherein the "Must Not Trip" curve and the "Must Trip" curve are separated by a "May Trip" region.

3. The power controller as recited in claim 1, wherein the detection circuit further comprises a voltage detection circuit that measures a load voltage.

4. The power controller as recited in claim 1, wherein the load voltage is at least 500 V.

5. The power controller as recited in claim 1, wherein the power controller comprises an AC power controller having a rated operating voltage of 0 to greater than or equal to 280 VAC, or a DC power controller having a rated operating voltage of 0 to greater than or equal to 400 VDC.

6. The power controller as recited in claim 1, wherein the control device comprises a fault latch circuit and a timer circuit.

7. The power controller as recited in claim 1, wherein the control device comprises one or more processors or a control circuit.

8. The power controller as recited in claim 7, wherein the one or more processors are programmable.

9. The power controller as recited in claim 7, wherein the one or more processors include one or more device drivers to interface with one or more plug-and-play internal or external devices.

10. The power controller as recited in claim 1, wherein the detection circuit further comprises a thermal sensor.

11. The power controller as recited in claim 1, wherein the detection circuit further comprises thermal shutdown circuit.

12. The power controller as recited in claim 1, wherein the detection circuit further comprises a smoke sensor.

13. The power controller as recited in claim 1, wherein the detection circuit further comprises a ground fault detector.

14. The power controller as recited in claim 1, wherein the detection circuit further comprises a load voltage detector.

15. The power controller as recited in claim 1, further comprising a power line signaling circuit communicably coupled to the control device.

16. The power controller as recited in claim 1, further comprising a lock down control circuit connected to the control device.

17. The power controller as recited in claim 1, wherein the one or more data interfaces are communicably coupled to the control device and electrically isolated from the control device, detection circuit and the switching circuit.

18. The power controller as recited in claim 1, wherein the one or more data interfaces comprise an analog communications interface or a digital communications interface.

19. The power controller as recited in claim 1, wherein the one or more data interfaces comprise an optical coupling device.

20. The power controller as recited in claim 1, wherein the one or more data interfaces comprise a display, a keyboard, one or more buttons, or one or more selector switches.

21. The power controller as recited in claim 1, wherein the one or more data interfaces comprise a control interface and a status interface.

22. The power controller as recited in claim 1, wherein the one or more data interfaces provide a remote control and monitoring of the power controller, a status of the power controller, a measurement of a current passing between the input power terminal and the output power terminal to a remote device, or a measurement of one or more thermal conditions to a remote device.

23. The power controller as recited in claim 1, wherein the power controller is an AC power controller and does not require the use of an output clamping circuit.

24. The power controller as recited in claim 1, further comprising a power source disposed within the power controller and connected to at least the control device and the detection circuit.

25. The power controller as recited in claim 24, wherein the power source comprises one or more batteries or one or more external control power source terminals.

26. The power controller as recited in claim 1, further comprising:
an isolated control power supply disposed within the power controller and connected to at least the control device and the detection circuit; and
one or more external control power source terminals connected to the isolated control power supply.

27. The power controller as recited in claim 26, further comprising a filter circuit connected between the one or more external control power source terminals and the isolated control power supply.

28. The power controller as recited in claim 1, further comprising an enclosure in which the one or more data interfaces, the input power terminal and the output power terminal are accessible from an exterior of the enclosure, and the control device, the detection circuit and the power switching circuit are disposed within the enclosure.

29. The power controller as recited in claim 28, wherein the enclosure is encapsulated.

30. The power controller as recited in claim 1, further comprising:
an antenna; and
a wireless transceiver connected to the antenna and the control device.

31. A power controller comprising:
an enclosure;
an input power terminal accessible from an exterior of the enclosure;
an output power terminal accessible from an exterior of the enclosure;

a power switching circuit disposed within the enclosure and connected in series between the input power terminal and the output power terminal, the power switching circuit comprising one or more power field-effect transistors;

a detection circuit disposed within the enclosure and connected to the power switching circuit, the detection circuit comprising a load current detection circuit having one or more resistors connected in series between one of the one or more power field-effect transistors and one of the power terminals, or between two of the one or more power field-effect transistors, such that a first voltage across the one or more resistors is proportional to the load current, a current squared time ($I^2t$) detection circuit having a RC circuit connected in parallel with the one or more resistors such that a second voltage across the RC circuit is proportional to a current squared time ($I^2t$) value, and a load voltage detection circuit that measures a load voltage between the input power terminal and the output power terminal;

one or more data interfaces accessible from an exterior of the enclosure;

an isolation circuit disposed within the enclosure and connected to the one or more data interfaces;

a control device disposed within the enclosure and connected to the power switching circuit, the detection circuit and the isolation circuit that automatically turns the power switching circuit "OFF" whenever the load current exceeds a first value or the current squared time value exceeds a second value or an "OFF" signal is received from the one or more isolated data interfaces, and automatically turns the power switching circuit "ON" whenever an "ON" signal is received from the one or more isolated data interfaces;

an isolated control power supply disposed within the enclosure and connected to at least the control device and the detection circuit;

one or more external control power source terminals accessible from an exterior of the enclosure; and a filter circuit disposed within the enclosure and connected between the one or more external control power source terminals and the isolated control power supply.

32. The power controller as recited in claim 31, wherein the first value and the second value are set in accordance with a "Must Not Trip" curve and a "Must Trip" curve, wherein the "Must Not Trip" curve and the "Must Trip" curve are separated by a "May Trip" region.

33. The power controller as recited in claim 31, wherein the load voltage is at least 500 V.

34. The power controller as recited in claim 31, wherein the power controller comprises an AC power controller having a rated operating voltage of 0 to greater than or equal to 280 VAC, or a DC power controller having a rated operating voltage of 0 to greater than or equal to 400 VDC.

35. The power controller as recited in claim 31, wherein the control device comprises a fault latch circuit and a timer circuit.

36. The power controller as recited in claim 31, wherein the control device comprises one or more processors or a control circuit.

37. The power controller as recited in claim 36, wherein the one or more processors are programmable.

38. The power controller as recited in claim 36, wherein the one or more processors include one or more device drivers to interface with one or more plug-and-play internal or external devices.

39. The power controller as recited in claim 31, wherein the detection circuit further comprises a thermal sensor, a thermal shutdown circuit, a smoke sensor, or a ground fault detector.

40. The power controller as recited in claim 31, wherein the detection circuit further comprises a load voltage detector.

41. The power controller as recited in claim 31, further comprising a power line signaling circuit communicably coupled to the control device.

42. The power controller as recited in claim 31, further comprising a lock down control circuit connected to the control device.

43. The power controller as recited in claim 31, wherein the one or more isolated data interfaces comprise an analog communications interface or a digital communications interface.

44. The power controller as recited in claim 31, wherein the one or more isolated data interfaces comprise an optical coupling device.

45. The power controller as recited in claim 31, wherein the one or more isolated data interfaces comprise a display, a keyboard, one or more buttons, or one or more selector switches.

46. The power controller as recited in claim 31, wherein the one or more isolated data interfaces comprise a control interface and a status interface.

47. The power controller as recited in claim 31, wherein the one or more isolated data interfaces provide a remote control and monitoring of the power controller, a status of the power controller, a measurement of a current passing between the input power terminal and the output power terminal to a remote device, or a measurement of one or more thermal conditions to a remote device.

48. The power controller as recited in claim 31, wherein the power controller does not require the use of an output clamping circuit.

49. The power controller as recited in claim 31, wherein the enclosure is encapsulated.

50. The power controller as recited in claim 31, further comprising:
an antenna; and
a wireless transceiver connected to the antenna and the control device.

51. A method for controlling a power from a power supply to a load comprising the steps of:
providing a power controller comprising an input power terminal, an output power terminal, a power switching circuit comprising a first power field effect transistor having a drain connected to the input power terminal and a gate connected to a control device, and a second power field-effect transistor having a gate connected to the control device and a source connected to the output power terminal, a detection circuit connected to the power switching circuit, one or more data interfaces, the control device connected to the power switching circuit, the detection circuit and the one or more data interfaces, and wherein the power controller is series connected between the power supply and the load using the input power terminal and the output power terminal, and wherein the detection circuit comprises:
one or more resistors connected in series between a source of the first power field-effect transistor and a drain of the second power field effect transistor, such that a first voltage across the one or more resistors is proportional to the load current, and a RC circuit connected in parallel with the one or more resistors such that a second voltage across the RC circuit is proportional to the current squared time value;

measuring a load current and a current squared time ($I^2t$) value between the input power terminal and the output power terminal using the detection circuit;

automatically turning the power switching circuit "OFF" using the control device whenever the load current exceeds a first value or the current squared time value exceeds a second value or an "OFF" signal is received from the one or more data interfaces; and automatically turning the power switching circuit "ON" using the control device whenever an "ON" signal is received from the one or more data interfaces.

52. The method as recited in claim 51, wherein the first value and the second value are set in accordance with a "Must Not Trip" curve and a "Must Trip" curve, wherein the "Must Not Trip" curve and the "Must Trip" curve are separated by a "May Trip" region.

53. The method as recited in claim 51, wherein the detection circuit further comprises a voltage detection circuit and further comprising the steps of:

measuring a load voltage using the voltage detection circuit; and automatically turning the power switching circuit "OFF" using the control device.

54. The method as recited in claim 51, wherein the load voltage is at least 500 V.

55. The method as recited in claim 51, wherein the power controller comprises an AC power controller having a rated operating voltage of 0 to greater than or equal to 280 VAC, or a DC power controller having a rated operating voltage of 0 to greater than or equal to 400 VDC.

56. The method as recited in claim 51, wherein the control device comprises a fault latch circuit and a timer circuit.

57. The method as recited in claim 51, wherein the control device comprises one or more processors or a control circuit.

58. The method as recited in claim 57, wherein the one or more processors are programmable.

59. The method as recited in claim 57, wherein the one or more processors include one or more device drivers to interface with one or more plug-and-play internal or external devices.

60. The method as recited in claim 51, wherein the detection circuit further comprises a thermal sensor, a thermal shutdown circuit, a smoke sensor, or a ground fault detector.

61. The method as recited in claim 51, wherein the detection circuit further comprises a load voltage detector.

62. The method as recited in claim 51, further comprising a power line signaling circuit communicably coupled to the control device.

63. The method as recited in claim 51, further comprising a lock down control circuit connected to the control device.

64. The method as recited in claim 51, wherein the one or more data interfaces are communicably coupled to the control device and electrically isolated from the control device, detection circuit and the switching circuit.

65. The method as recited in claim 51, wherein the one or more data interfaces comprise an analog communications interface or a digital communications interface.

66. The method as recited in claim 51, wherein the one or more data interfaces comprise an optical coupling device.

67. The method as recited in claim 51, wherein the one or more data interfaces comprise a display, a keyboard, one or more buttons, or one or more selector switches.

68. The method as recited in claim 51, wherein the one or more data interfaces comprise a control interface and a status interface.

69. The method as recited in claim 51, further comprising the steps of:

providing a remote control and monitoring of the power controller using the one or more data interfaces;

providing a status of the power controller using the one or more data interfaces;

providing a measurement of a current passing between the input power terminal and the output power terminal to a remote device using the one or more data interfaces; or providing a measurement of one or more thermal conditions to a remote device using the one or more data interfaces.

70. The method as recited in claim 51, wherein the power controller does not require the use of an output clamping circuit.

71. The method as recited in claim 51, further comprising a power source disposed within the power controller and connected to at least the control device and the detection circuit.

72. The method as recited in claim 71, wherein the power source comprises one or more batteries or one or more external control power source terminals.

73. The method as recited in claim 51, further comprising:

an isolated control power supply disposed within the power controller and connected to at least the control device and the detection circuit; and one or more external control power source terminals connected to the isolated control power supply.

74. The method as recited in claim 73, further comprising a filter circuit connected between the one or more external control power source terminals and the isolated control power supply.

75. The method as recited in claim 51, further comprising an enclosure in which the one or more data interfaces, the input power terminal and the output power terminal are accessible from an exterior of the enclosure, and the control device, the detection circuit and the power switching circuit are disposed within the enclosure.

76. The method as recited in claim 75, wherein the enclosure is encapsulated.

77. The method as recited in claim 51, further comprising:

an antenna; and a wireless transceiver connected to the antenna and the control device.

* * * * *